United States Patent [19]

Gandolfi et al.

[11] Patent Number: 4,881,117

[45] Date of Patent: Nov. 14, 1989

[54] SEMICONDUCTOR POWER DEVICE FORMED OF A MULTIPLICITY OF IDENTICAL PARALLEL-CONNECTED ELEMENTS

[75] Inventors: Luciano Gandolfi, Corsico; Giuseppe Ferla, Catania, both of Italy

[73] Assignee: SGS-ATES Componenti Elettronici S.p.A., Milan, Italy

[21] Appl. No.: 582,793

[22] Filed: Feb. 23, 1984

[30] Foreign Application Priority Data

Feb. 28, 1983 [IT] Italy ................................. 19832 A/83

[51] Int. Cl.[4] ...................... H01L 23/02; H01L 23/12
[52] U.S. Cl. .......................................... 357/74; 357/70
[58] Field of Search ...................................... 357/70, 74

[56] References Cited

U.S. PATENT DOCUMENTS

| | | | |
|---|---|---|---|
| 4,247,864 | 1/1981 | Lockard | 357/70 |
| 4,346,396 | 8/1982 | Carroll et al. | 357/70 |
| 4,532,538 | 7/1985 | Wurz | 357/70 |

*Primary Examiner*—William L. Sikes
*Assistant Examiner*—Robert E. Wise
*Attorney, Agent, or Firm*—Wenderoth, Lind & Ponack

[57] ABSTRACT

A multiplicity of semiconductor chips constituting the active elements of a semiconductor power device are attached, in a predetermined configuration, to a metal plate which acts as both a support and a first electrical terminal. Two other electrical terminals are formed by two metal electrodes having an interdigitated structure with the fingers of one electrode being inserted between those of the other electrode and which are positioned above the semiconductor chips and have tabs for establishing a connection between the electrodes and the two contact areas of each chip.

4 Claims, 1 Drawing Sheet

SEMICONDUCTOR POWER DEVICE FORMED OF A MULTIPLICITY OF IDENTICAL PARALLEL-CONNECTED ELEMENTS

BACKGROUND OF THE INVENTION

The present invention relates to semiconductor devices and, more particularly, to three-terminal power device, such as discrete transistors and Darlington pairs, formed of identical active elements interconnected in parallel.

Prior art power transistors and Darlington-connected transistors are known to include 3 or 4 semiconductor chips in a single housing, each of which constitutes a functionally complete component, with their terminals interconnected in parallel to three wires which protrude from the housing and constitute the terminals of the device. In FIG. 1 of the accompanying drawings, this type of device is illustrated schematically in plan view.

Three identical semiconductor elements 1, e.g. three transistors having their collector electrodes on the bottom of the chip and their base and emitter electrodes on the top thereof, are soldered to a metal plate 2 having a lug 2' located on one side thereof. Six wires 3 each have one end soldered to the base contact areas 1' or to the emitters of the transistors 1 and each have their other end soldered to two metal strips 4 and 5 that constitute the base and emitter terminals of the device. A housing represented in the drawing by a rectangle 6 holds all the elements of the device except for a portion of the lug 2' of the metal plate 2 and an end portion of each of the strips 4 and 5. The housing may be a solid block of plastic obtained by means of a molding process known in the prior art, or a metal encapsulation properly filled with an inert gas and sealed hermetically. In this instance, the lug 2' and the end portions of the strips 4 and 5 are electrically insulated from the metal encapsulation. In some prior art devices, the metal plate 2 forms part of the bottom wall of the device and is adapted to be mechanically connected to a large metal body not shown in the figure for the necessary outward dissipation of the heat produced by the device during its operation or, in other prior art devices, is mechanically connected to a solid metal plate by means of an electrically insulating, yet thermally conducting, layer, e.g., of beryllium oxide. It will be understood that in the first instance, the connection between the collector of the device and the external circuit is established by the heat sink, so that the lug 2' of the plate 2 is unnecessary, while in the second instance, said lug is indispensable as the external electrical connection.

Prior art devices of this type are capable of operating at power levels of up to 500 Watts. In order to handle higher power levels by the use of a single device, as is being applied in the industry to an ever-increasing extent, it would be necessary to increase the number of semiconductor chips constituting the elementary components of the device. However, this would unduly increase the length of the device if the geometry depicted in FIG. 1 is to be maintained, or it would result in very large and complex structures if one is to interconnect in parallel several structures of the type shown. In either case, assembly with automatic equipment would create problems because of the large number of precision soldering operations needed to connect the chips to the metal strips of emitter and base. Finally, when designing such a device, one should bear in mind the necessity of minimizing the length of the connecting wires and, above all, keeping the length constant so as not to change the uniformity of activation of the single components by the introduction of several resistors connected in series with the bases and with the emitters of the elementary components.

SUMMARY OF THE INVENTION

Therefore, the primary object of the present invention is to provide a three-terminal semiconductor device formed of a multiplicity of single active parallel-connected elements and having acceptable dimensions that lend themselves to assembly by automatic equipment, and being electrically and mechanically reliable.

These and other objects are achieved by making use of the device defined and characterized in the appended claims.

The abovenoted object may be effected by providing a device in which multiplicity of semiconductor chips constituting the active elements of a semiconductor power device are attached, in a predetermined configuration, to a metal plate which acts as both a support and a first electrical terminal. Two other electrical terminals are formed by two metal electrodes having an interdigitated structure with the fingers of one electrode being inserted between those of the other electrode and which are positioned above the semiconductor chips and have tabs for establishing a connection between the electrodes and the two contact areas of each chip.

BRIEF DESCRIPTION OF THE DRAWINGS

The concept of the invention will be better understood from the ensuing detailed description of a specific embodiment given solely by way of non-limitative example, reference being made to the accompanying drawings, in which.

DESCRIPTION OF THE PREFERRED EMBODIMENT

Figure 2:
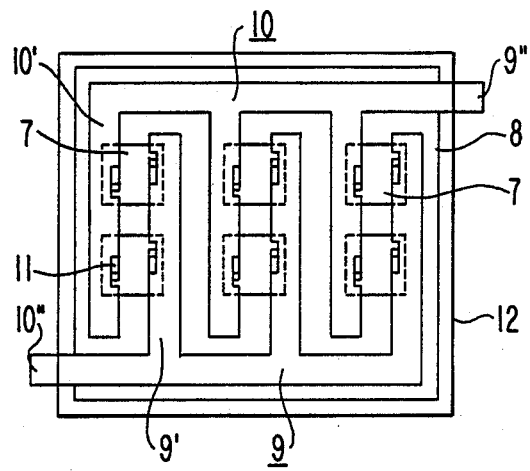
FIG. 2 illustrates a device in accordance with the present invention.
Figure 3:
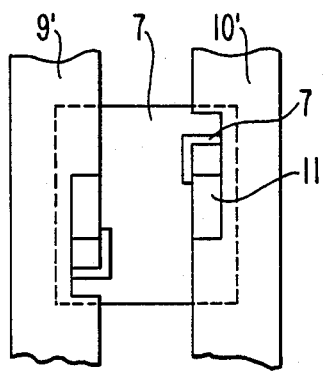
FIGS. 3 and 4 respectively disclose, in plan view and in section, an enlarged detail of the device shown in FIG. 2.
Figure 4:
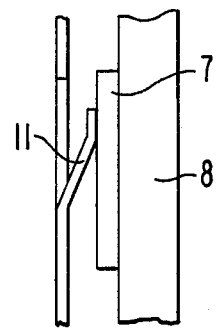

Now, referring to the drawings, the device of FIGS. 2-4 consists of the parallel interconnection of six elementary components, e.g., transistors, formed by the same number of semiconductor chips denoted by the reference numeral 7. The number of chips has been limited to six in order to simplify the drawing, but in reality there could be many more chips. One should bear in mind that the greater the number of elementary components, the more appreciable the advantages of the present invention. Each of the chips 7 have a large surface which constitutes the collector electrode of the elementary transistor and which is attached to a metal plate 8. For example, this attachment can be effected by means of a known prior art soldering process that uses a soldering alloy having a low melting point.

Two substantially identical electrodes 9 and 10, having an interdigitated structure and insulated from one another, are placed in the same plane above the plate 8 and above the semiconductor chips 7 with the teeth 9' of one electrode being inserted between the teeth 10' of the other electrode. Each of the teeth 9' and 10' of the interdigitated electrodes is arranged on a row of chips 7, so they rise above the contact areas 7' of the base and of the emitter of each of the chips 7 and have projecting parts or lugs 11, which are in electrical contact with the areas 7'.

In the illustrated device, the electrical contact is made simply by pressure, the electrodes 9 and 10 and the corresponding lugs 11 being properly dimensioned. However, in other embodiments of the present invention, the electrical contact can be made by soldering, making use of one of the customary processes that utilizes soldering alloys having a low melting point.

Figure 1:
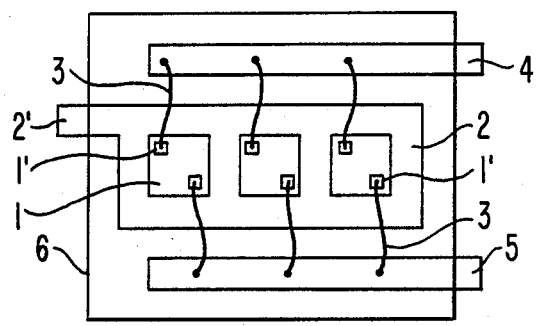
FIG. 1, already mentioned and explained above, depicts a prior art device.

The whole structure, with the exception of at least a part of the external surface of the plate 8 and the end portions 9" and 10" of the electrodes 9 and 10, is included in a block of plastic represented in FIG. 2 by a rectangle 12 and obtained by a molding process known in the prior art. In other embodiments of the invention, the housing of the device is a hermetically sealed metal box and/or the plate 8 is attached by means of an electrically insulating layer to a metal plate, as described above with reference to FIG. 1.

The electrodes 9 and 10 with their lugs 11 can be formed from a single copper plate in a single blanking operation. Advantageously, a multiplicity of electrode pairs intended for various devices can be formed at one time, which remain interconnected during all the mounting operations and are separated after the molding. According to the teachings of the present invention, structures with dimensions much smaller than those of the prior art can be realized, due to the fact that the arrangement of the base and emitter electrodes above the plane of the chips enables the chips to be spaced very close to one another. These spacings can be even smaller than those possible with the embodiment depicted in FIGS. 2-4 if the base and emitter electrodes, in accordance with a modification of the present invention, are spaced from each other in different planes. A device according to the present invention can be fabricated by the use of an entire semiconductor slice comprising a multiplicity of chips without cutting and separating them. In such a case, a defective chip can be eliminated simply by lifting the prearranged lugs 11 used for the electrical connection to the corresponding contact areas of its base and emitter It should also be noted that a device in accordance with the present invention lends itself to fabrication with automatic equipment, especially because of the structure of the contact electrodes that enable simultaneous contacting of all the elementary component of the device.

It is obvious from the above that the structure advocated by the invention is particularly suitable for three-terminal semiconductor devices capable of handling power levels in excess of 500 Watts. It will be understood, however, that the invention can also be used to advantage in all cases where parallel connection of many elementary components is appropriate, irrespective of the power of the final device.

We claim:

1. A three-terminal semiconductor device formed of a plurality of active elements interconnected in parallel, in which each of said plurality of active elements are respectively formed in respective semiconductor chips and have three contact areas which constitute electrical terminals of said active element, the first of said three contact areas being located on one surface of said chip and the second and third of said contact areas being located on another surface of said chip, said device comprising:
   a metal supporting plate to which are attached said plurality of active elements arranged in a predetermined configuration, said first contact areas of each of said active elements being in ohmic contact with said plate so as to thereby connect all of said first contact areas together;
   a first metal electrode and a second metal electrode which are respectively in electrical contact with said second and third contact areas of each of said active elements so as to thereby connect all of said second contact areas together and all of said third contact areas together, said supporting plate and first and second electrodes thereby connecting said active elements in parallel;
   a housing for hermetically sealing all of said device except for a portion of said metal plate and portions of said first and second electrodes, said portions forming said three terminals of said device;
   wherein said first and second metal electrodes are arranged adjacent to said active elements and each of electrodes have lugs which are respectively located in the area of said second and third contacts of said active elements, such that at least some of said lugs are electrically connected, by an ohmic contact, to said second and third contact areas; and
   wherein said first and second electrodes each have a metal sheet structure in the form of a comb with a plurality of teeth which are positioned so as to be insulated from each other and in the same plane and wherein said plurality of teeth of said first electrode are arranged between said plurality of teeth of said second electrode, and wherein said lugs of said first and second electrodes are formed by flanged portions of said metal sheet.

2. A three-terminal semiconductor device as set forth in claim 1, wherein all of said plurality of active elements comprise an integral part of a single semiconductor slice.

3. A three-terminal semiconductor device formed of a plurality of active elements interconnected in parallel, in which each of said plurality of active elements are respectively formed in respective semiconductor chips and have three contact areas which constitute electrical terminals of said active element, the first of said three contact areas being located on one surface of said chip and the second and third of said contact areas being located on another surface of said chip, said device comprising:
   a metal supporting plate to which are attached said plurality of active elements arranged in a predetermined configuration, said first contact areas of each of said active elements being in ohmic contact with said plate so as to thereby connect all of said first contact areas together;
   a first metal electrode and a second metal electrode which are respectively in electrical contact with said second and third contact areas of each of said active elements so as to thereby connect all of said second contact areas together and all of said third contact areas together, said supporting plate and first and second electrodes thereby connecting said active elements in parallel;
   a housing for hermetically sealing all of said device except for a portion of said metal plate and portions of said first and second electrodes, said portions forming said three terminals of said device;

wherein said first and second metal electrodes are arranged adjacent to said active elements and each of electrodes have lugs which are respectively located in the area of said second and third contacts of said active elements, such that at least some of said lungs are electrically connected, by an ohmic contact, to said second and third contact areas; and wherein said housing comprises a metal plate which is attached to said metal supporting plate by means of an electrically insulating layer; and wherein said first and second electrodes each have a metal sheet structure in the form of a comb with a plurality of teeth which are positioned so as to be insulated from each other and in the same plane and wherein said plurality of teeth of said first electrode are arranged between said plurality of teeth of said second electrode, and wherein said lugs of said first and second electrodes are formed by flanged portions of said metal sheet.

4. A three-terminal semiconductor device as set forth in claim 3, wherein all of said plurality of active elements comprise an integral part of a single semiconductor slice.

* * * * *